(12) United States Patent
Blanksby

(10) Patent No.: US 10,216,567 B1
(45) Date of Patent: Feb. 26, 2019

(54) DIRECT PARITY ENCODER

(71) Applicant: Avago Technologies International Sales Pte. Limited, Singapore (SG)

(72) Inventor: Andrew Blanksby, Lake Oswego, OR (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/108,523

(22) Filed: Aug. 22, 2018

(51) Int. Cl.
*G06F 11/10* (2006.01)
*H03K 19/21* (2006.01)
*H03M 13/29* (2006.01)
*G06F 11/07* (2006.01)

(52) U.S. Cl.
CPC ......... *G06F 11/10* (2013.01); *G06F 11/0772* (2013.01); *H03K 19/21* (2013.01); *H03M 13/2909* (2013.01)

(58) Field of Classification Search
CPC ................................ G06F 11/10; H03K 19/21
See application file for complete search history.

(56) References Cited

U.S. PATENT DOCUMENTS

| | | | | |
|---|---|---|---|---|
| 4,004,100 A * | 1/1977 | Takimoto | ............... | H04J 3/0611 370/509 |
| 6,928,602 B2 * | 8/2005 | Yamagishi | ........... | H03M 13/118 714/781 |
| 7,039,852 B2 * | 5/2006 | Dent | ......................... | G06F 7/53 714/781 |
| 7,055,088 B2 * | 5/2006 | Betts | ..................... | H03M 13/23 714/774 |
| 7,116,710 B1 | 10/2006 | Jin et al. | | |
| 7,421,032 B2 | 9/2008 | Jin et al. | | |
| 7,434,138 B2 * | 10/2008 | Lin | ................... | H03M 13/2703 714/755 |
| 7,669,109 B2 * | 2/2010 | Hocevar | ........... | H03M 13/1114 714/780 |
| 7,916,781 B2 | 3/2011 | Jin et al. | | |
| 2009/0100314 A1 * | 4/2009 | Danninger | ........ | H03M 13/2732 714/755 |
| 2009/0125780 A1 * | 5/2009 | Taylor | ................ | H03M 13/1137 714/752 |

OTHER PUBLICATIONS

Lin et al., Efficient Encoding for Dual-Diagonal Structured LDPC Codes Based on Parity Bit Prediction and Correction, IEEE, 2008, 4 pages.

(Continued)

*Primary Examiner* — Joseph D Torres
(74) *Attorney, Agent, or Firm* — Foley & Lardner LLP

(57) ABSTRACT

Various aspects of systems for generating parity bits for encoding based on a portion of a generator matrix are disclosed. In one aspect, a generator matrix includes a sub-block including a first set of elements circularly shifted from an identity matrix by a first amount, and a second set of elements circularly shifted from the identity matrix by a second amount. Bit permutation circuitry generates first bits according to input bits and the first amount. Each of the first bits is provided as input to a corresponding XOR device of XOR devices. Each of a set of storage registers stores an output of the corresponding XOR device. The bit permutation circuitry generates second bits according to the input bits and the second amount. The XOR devices perform bit-wise XOR operations on the stored outputs and the generated second bits, to provide a portion of the parity bits.

20 Claims, 8 Drawing Sheets

(56) References Cited

OTHER PUBLICATIONS

Richardson et al., Efficient Encoding of Low-Density Parity-Check Codes, IEEE Transactions on Information Theory, vol. 47, No. 2, Feb. 2001, 19 pages.

* cited by examiner

US 10,216,567 B1

DIRECT PARITY ENCODER

FIELD OF THE DISCLOSURE

This disclosure generally relates to systems and methods for improving encoding process of a communications system.

BACKGROUND OF THE DISCLOSURE

Error correcting codes enable information data to be exchanged between a transmitter communication system and a receiver communication system in a reliable manner. A transmitter communication system encodes the information data to obtain a codeword. The codeword is encoded information data. The transmitter communication system transmits the codeword to the receiver communication system. Due to noise in the communication channel, the transmission received by the receiver communication system may not be identical to the transmitted codeword. Encoding information data allows a receiver communication system with a proper decoding process to recover the information data from the received transmission despite such noise. For example, the transmitter communication system transmits parity bits to the receiver communication system. The parity bits allow the receiver communication system to verify whether the received transmission is a valid codeword and to correct errors in the transmission if the received transmission is not a valid codeword. In one approach, generating parity bits involves a complex process.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
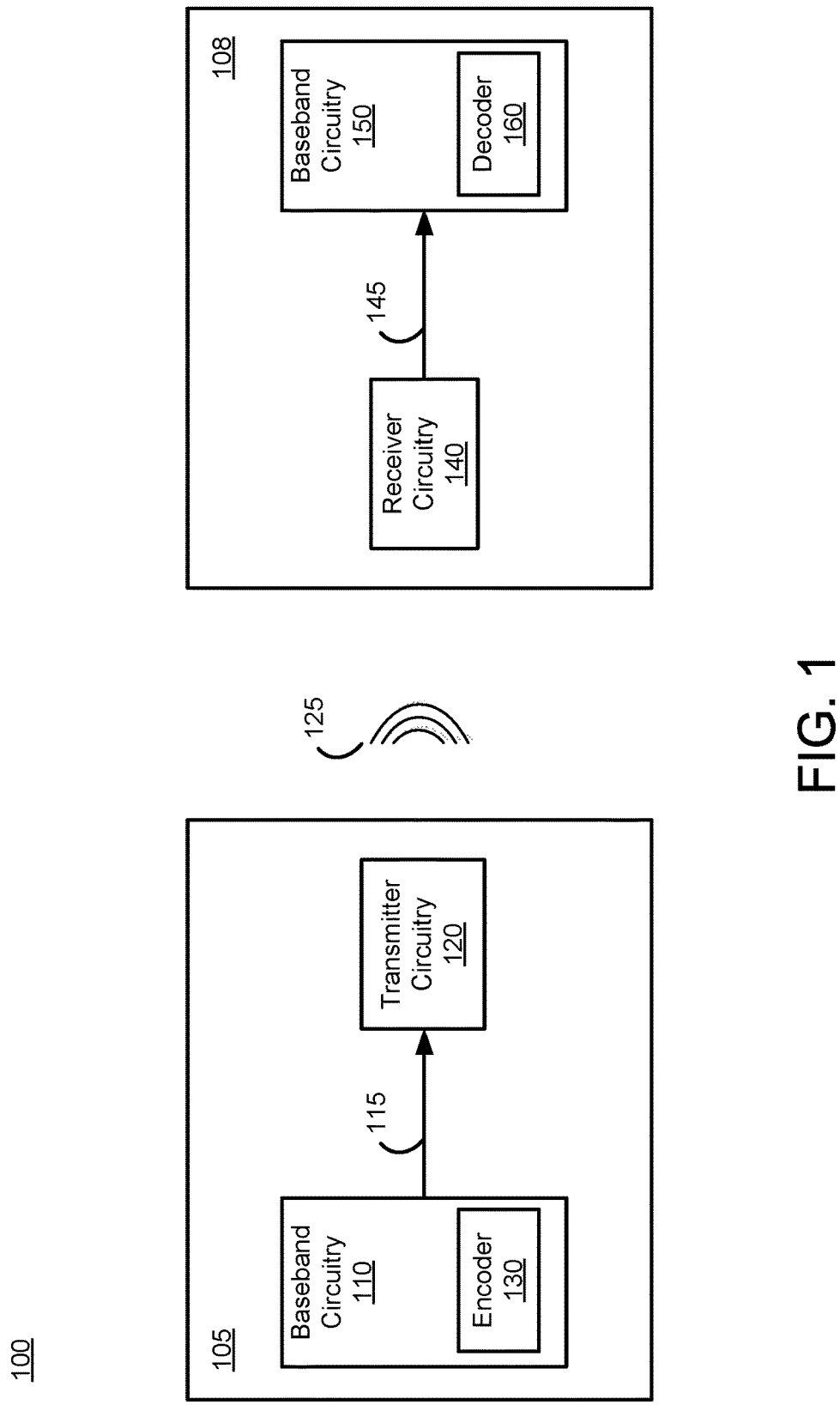
FIG. 1 is a diagram depicting an example communication environment with communication systems, according to one or more embodiments.

The details of various embodiments of the methods and systems are set forth in the accompanying drawings and the description below.

DETAILED DESCRIPTION

Various aspects of a system, a method, and a non-transitory computer readable medium for generating parity bits for encoding based on a portion of a generator matrix are disclosed. A generator matrix is a matrix, to which information data is applied to generate encoded data or a codeword. Examples of information data include image, audio, video, text, or any data. In one or more embodiments, the system generates parity bits directly from a portion of the generator matrix. The system appends the parity bits to the information bits to form a codeword, and transmits the codeword to another system, in one or more embodiments.

In some embodiments, the system includes a processor that divides the generator matrix into a first portion and a second portion. The first portion includes the identity matrix, and the second portion includes an array of sub-blocks. The array of sub-blocks includes M number of columns of sub-blocks and J number of rows of sub-blocks. A sub-block includes Z number of rows and Z number of columns. A sub-block includes (i) a first set of elements circularly shifted from an identity matrix by a first amount, and (ii) a second set of elements circularly shifted from the identity matrix by a second amount. In some embodiments, the sub-block includes additional sets of elements circularly shifted by different amounts.

In some embodiments, the system includes a parity bit generation circuitry coupled to the processor. The parity bit generation circuitry is configured to generate parity bits according to the array of sub-blocks. In some embodiments, the parity bit generation circuitry includes a bit permutation circuitry, Z by M number of XOR devices coupled to the bit permutation circuitry, M sets of storage registers, and a control circuitry coupled to the bit permutation circuitry and the M sets of storage registers. Each set of the M sets of storage registers includes Z number of storage registers, where each of the Z number of storage registers is coupled to a corresponding XOR device of the Z number of XOR devices. In one aspect, the control circuitry is configured to cause the bit permutation circuitry to generate Z number of first bits according to Z number of input bits of the information data. The Z number of first bits are equal to the Z number of input bits, when circularly shifted according to the first amount. Each of the Z number of first bits is provided as input to a corresponding XOR device of the Z number of XOR devices.

The control circuitry is further configured to cause each storage register of a first set of the M sets of storage registers to store an output of the corresponding XOR device of the Z number of XOR devices. The control circuitry is further configured to cause the bit permutation circuitry to generate Z number of second bits according to the Z number of input bits. The Z number of second bits are equal to the Z number of input bits when circularly shifted according to the second amount. The control circuitry is further configured to cause the Z number of XOR devices to perform bit-wise XOR operations on the Z number of outputs from the first set of the M sets of storage registers and the generated Z number of second bits from the bit permutation circuitry.

Advantageously, the disclosed system generates parity bits without relying on a parity check matrix, in one or more embodiments. In one approach, parity bits are generated according to a parity check matrix. A parity check matrix defines a set of equations that are satisfied by any valid codeword. However, generating parity bits according to the parity check matrix can be computationally inefficient in terms of hardware and computing resources. For example, one well-known method of using a parity check matrix for encoding low density parity check ("LDPC") codes, taught by Richardson and Urbanke in IEEE Transactions on Information Theory, Vol. 47, No. 2 (February 2001), requires computing the inverse of a matrix that is itself composed of portions of the parity check matrix. Computing that inverse, and other operations of this method, can be computationally exhaustive. Moreover, although the Richardson and Urbanke method is one of the known ways of encoding for LDPC codes, it remains a multi-step, complex, computationally intensive operation, and thus consumes significant hardware and computing resources. In one or more embodiments, the disclosed system herein generates parity bits directly from a portion of the generator matrix. By obviating the parity check matrix, parity bits are obtained in a computationally efficient manner. In particular, the disclosed system generates the parity bits by generating new bits that are equal to shifted bits of the input bits according to the arrangement of elements in the sub-blocks, and by performing simple XOR operations while obviating multiple steps or complex calculations to form and inverse matrices.

Unlike encoding for repetition codes, the encoding methods and systems described herein do not repeat input bits as part of the process of forming parity bits. Rather than repeating bits, the disclosed systems and methods combine bits together to form parity bits.

Various embodiments of an encoder for wireless local area networking (WLAN) communication are disclosed. In one or more embodiments, the encoder includes a processor configured to divide a generator matrix into a first portion and a second portion. In one or more embodiments, the second portion of the generator matrix includes an array of sub-blocks. In one or more embodiments, the array of sub-blocks is arranged in rows and columns. In one or more embodiments, each row includes M number of sub-blocks and each column includes J number of sub-blocks. In one or more embodiments, each sub-block includes Z number of rows and Z number of columns. In one or more embodiments, M, J, and Z are integers. In one or more embodiments, a sub-block of the array of sub-blocks includes (i) a first set of elements circularly shifted from an identity matrix by a first amount, and (ii) a second set of elements circularly shifted from the identity matrix by a second amount. In one or more embodiments, the encoder includes parity bit generation circuitry coupled to the processor. In one or more embodiments, the parity bit generation circuitry is configured to generate parity bits according to the array of sub-blocks. In one or more embodiments, the parity bit generation circuitry includes bit permutation circuitry, Z number of XOR devices coupled to the bit permutation circuitry, and M sets of storage registers. In one or more embodiments, each set of the M sets of storage registers includes Z number of storage registers. In one or more embodiments, each of the Z number of storage registers is coupled to a corresponding XOR device of the Z number of XOR devices. In one or more embodiments, the parity bit generation circuitry includes control circuitry coupled to the bit permutation circuitry and the M sets of storage registers. In one or more embodiments, the control circuitry is configured to cause the bit permutation circuitry to generate Z number of first bits according to Z number of input bits and the first amount. In one or more embodiments, the Z number of first bits are equal to the Z number of input bits when circularly shifted according to the first amount. In one or more embodiments, each of the Z number of first bits is provided as input to a corresponding XOR device of the Z number of XOR devices. In one or more embodiments, the control circuitry is configured to cause each storage register of a first set of the M sets of storage registers to store an output of the corresponding XOR device of the Z number of XOR devices. In one or more embodiments, the control circuitry is configured to cause the bit permutation circuitry to generate Z number of second bits according to the Z number of input bits and the second amount, the Z number of second bits equal to the Z number of input bits when circularly shifted according to the second amount. In one or more embodiments, the control circuitry is configured to cause the Z number of XOR devices to perform bit-wise XOR operations on the Z number of outputs from the first set of the M sets of storage registers and the generated Z number of second bits from the bit permutation circuitry.

In one or more embodiments, the control circuitry is configured to cause the first set of the M sets of storage registers to store results of the bit-wise XOR operations performed on the Z number of outputs from the first set of the M sets of storage registers and the generated Z number of second bits from the bit permutation circuitry, while sets of the M sets of storage registers other than the first set retain the information they currently store rather than "clocking in" new results of the bit-wise XOR operations.

In one or more embodiments, the control circuitry is configured to reset the first set of the M sets of storage registers during a first time period, cause the first set of the M sets of storage registers to store results of the bit-wise XOR operations performed on the Z number of outputs from the first set of the M sets of storage registers and the generated Z number of first bits from the bit permutation circuitry during a second time period after the first time period, cause the first set of the M sets of storage registers to store results of the bit-wise XOR operations performed on the Z number of outputs from the first set of the M sets of storage registers and the generated Z number of second bits from the bit permutation circuitry, during a third time period after the second time period.

In one or more embodiments, each XOR device of the Z number of XOR devices includes a first input port coupled to a corresponding output port of Z number of output ports of the bit permutation circuitry, a second input port coupled to an output port of a corresponding storage register of the first set, and an output port coupled to an input port of the corresponding storage register of the first set.

In one or more embodiments, another sub-block of the array of sub-blocks includes a third set of elements circularly shifted from the identity matrix by a third amount and a fourth set of elements circularly shifted from the identity matrix by a fourth amount.

In one or more embodiments, the parity bit generation circuitry further includes Z number of additional XOR devices coupled to the bit permutation circuitry. In one or more embodiments the control circuitry is configured to cause the bit permutation circuitry to generate Z number of third bits according to the Z number of input bits and the third amount, the Z number of third bits equal to the Z number of input bits when circularly shifted according to the third amount, each of the Z number of third bits provided as input to a corresponding XOR device of the Z number of additional XOR devices. In one or more embodiments, the control circuitry is configured to cause each storage register of a second set of the M sets of storage registers to store an output of the corresponding XOR device of the Z number of additional XOR devices. In one or more embodiments, the control circuitry is configured to cause the bit permutation circuitry to generate Z number of fourth bits according to the Z number of input bits and the fourth amount, the Z number of fourth bits equal to the Z number of input bits when circularly shifted according to the fourth amount. In one or more embodiments, the control circuitry is configured to cause the Z number of additional XOR devices to perform bit-wise XOR operations on the Z number of outputs from the second set of the M sets of storage registers and the generated Z number of fourth bits from the bit permutation circuitry.

In one or more embodiments, the control circuitry is configured to cause the second set of the M sets of storage registers to store results of the bit-wise XOR operations performed on the stored Z number of outputs from the second set of the M sets of storage registers and the generated Z number of fourth bits from the bit permutation circuitry, while sets of the M sets of storage registers other than the second set retain their stored information rather than "clocking in" new results of the additional bit-wise XOR operations.

In one or more embodiments, the control circuitry is configured to reset the first set of the M sets of storage registers and the second set of the M sets of storage registers during a first time period. In one or more embodiments, the control circuitry is configured to cause the first set of the M sets of storage registers to store the results of the bit-wise XOR operations performed on the Z number of outputs from the first set of the M sets of storage registers and the generated Z number of first bits from the bit permutation circuitry during a second time period after the first time period. In one or more embodiments, the control circuitry is configured to cause the first set of the M sets of storage registers to store results of the bit-wise XOR operations performed on the Z number of outputs from the first set of the M sets of storage registers and the generated Z number of second bits from the bit permutation circuitry during a third time period after the second time period. In one or more embodiments, the control circuitry is configured to cause the second set of the M sets of storage registers to store results of the bit-wise XOR operations performed on the Z number of outputs from the second set of the M sets of storage registers and the generated Z number of third bits from the bit permutation circuitry during a fourth time period after the third time period. In one or more embodiments, the control circuitry is configured to cause the second set of the M sets of storage registers to store results of the bit-wise XOR operations performed on the Z number of outputs from the second set of the M sets of storage registers and the generated Z number of fourth bits from the bit permutation circuitry during a fifth time period after the fourth time period.

In one or more embodiments, the parity bit generation circuitry further includes Z number of multiplexers, each multiplexer of the Z number of multiplexers coupled between the corresponding XOR device and a corresponding storage register of the first set, and Z number of additional multiplexers, each multiplexer of the Z number of additional multiplexers coupled between the corresponding XOR device and a corresponding storage register of a second set of the M sets of storage registers.

In one or more embodiments, the parity bit generation circuitry further includes a feedback multiplexer including M number of input ports, each of the M number of input ports coupled to an output port of a corresponding storage register of M number of storage registers, each of the M number of storage registers from a different set of the M sets, and an output port coupled to an input port of a XOR device of the Z number of XOR devices.

In one or more embodiments, the control circuitry is configured to cause the feedback multiplexer to electrically couple an output port of a storage register of the M number of storage registers to the input port of the XOR device, while a multiplexer of the Z number of multiplexers electrically couples an output port of the XOR device to an input port of the storage register of the M number of storage registers.

In one or more embodiments, each XOR device of the Z number of XOR devices is a two-input XOR device.

In one or more embodiments, the first portion of the generator matrix is another identity matrix including J by Z number of rows and J by Z number of columns.

Although various embodiments disclosed herein are described for encoding data for a wireless communication (e.g., wireless local area network (WLAN) conforming to any IEEE 802.11 standard), principles disclosed herein are applicable to other types of communication (e.g., wired communication) or any process that performs encoding for LDPC codes.

Referring to FIG. 1, illustrated is a diagram depicting an example communication environment 100 including communication systems 105, 108, according to one or more embodiments. In one embodiment, the communication system 105 includes a baseband circuitry 110 and a transmitter circuitry 120, and the communication system 108 includes a baseband circuitry 150 and a receiver circuitry 140. In one aspect, the communication system 105 is considered a transmitter communication system, and the communication system 108 is considered a receiver communication system. These components operate together to exchange data (e.g., messages or frames) through a wireless medium. These components are embodied as application specific integrated circuit (ASIC), field programmable gate array (FPGA), or any combination of these, in one or more embodiments. In some embodiments, the communication systems 105, 108 include more, fewer, or different components than shown in FIG. 1. For example, each of the communication systems 105, 108 includes transceiver circuitry to allow bi-directional communication between the communication systems 105, 108 or with other communication systems.

The baseband circuitry 110 of the communication system 105 is a circuitry that generates the baseband data 115 for transmission. The baseband data 115 includes information data (e.g., signal(s)) at a baseband frequency for transmission. In one approach, the baseband circuitry 110 includes an encoder 130 that encodes the data, and generates or outputs parity bits. In one aspect, the baseband circuitry 110 obtains a generator matrix, or uses a previously produced generator matrix, and encodes the information data by applying the information data to the generator matrix to obtain a codeword. In some embodiments, the baseband circuitry 110 stores one or more generator matrices that conform to any IEEE 802.11 standard for WLAN communication. The baseband circuitry 110 retrieves the stored generator matrix in response to detecting information data to be transmitted, or in response to receiving an instruction to encode the information data. In one approach, the baseband circuitry 110 generates the parity bits according to a portion of the generator matrix, and appends the parity bits to the information bits to form a codeword. The baseband circuitry 110 generates the baseband data 115 including the codeword for the communication system 108, and provides the baseband data 115 to the transmitter circuitry 120. Detailed implementations and operations of the encoder 130 are provided below with respect to FIGS. 2 through 6.

The transmitter circuitry 120 of the communication system 105 includes or corresponds to a circuitry that receives the baseband data 115 from the baseband circuitry 110 and transmits a wireless signal 125 according to the baseband data 115. In one configuration, the transmitter circuitry 120 is coupled between the baseband circuitry 110 and an antenna (not shown). In this configuration, the transmitter circuitry 120 up-converts the baseband data 115 from the baseband circuitry 110 onto a carrier signal to generate the wireless signal 125 at an RF frequency (e.g., 10 MHz to 60 GHz), and transmits the wireless signal 125 through the antenna.

The receiver circuitry 140 of the communication system 108 is a circuitry that receives the wireless signal 125 from the communication system 105 and obtains baseband data 145 from the received wireless signal 125. In one configuration, the receiver circuitry 140 is coupled between the baseband circuitry 150 and an antenna (not shown). In this configuration, the receiver circuitry 140 receives the wireless signal 125 though an antenna, and down-converts the wireless signal 125 at an RF frequency according to a carrier signal to obtain the baseband data 145 from the wireless signal 125. The receiver circuitry 140 then provides the baseband data 145 to the baseband circuitry 150.

The baseband circuitry 150 of the communication system 108 includes or corresponds to a circuitry that receives the baseband data 145 from the receiver circuitry 140 and obtains information data from the received baseband data 145. In one embodiment, the baseband circuitry 150 includes a decoder 160 that extracts information and parity bits from the baseband data 145. The decoder 160 decodes the baseband data 145 to obtain the information data generated by the baseband circuitry 110 of the communication system 105.

Figure 2:
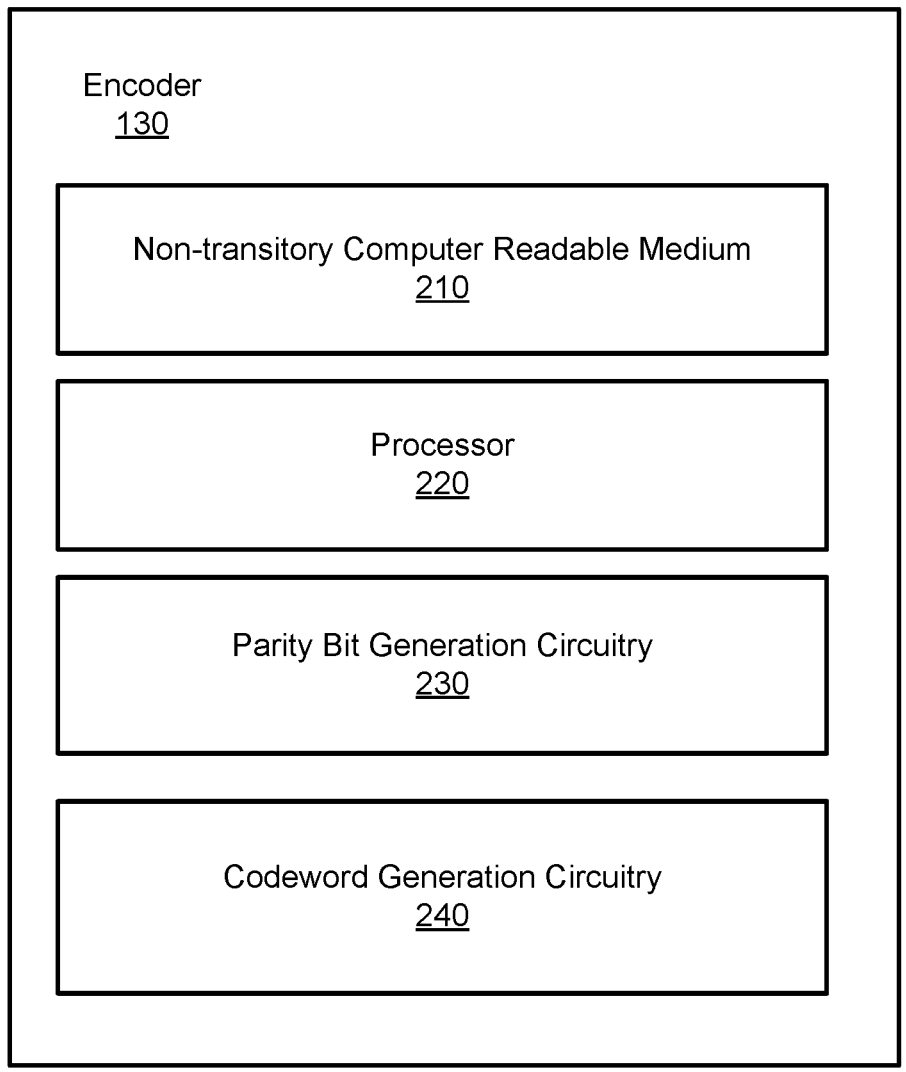
FIG. 2 is a diagram depicting an example encoder of a communication system shown in FIG. 1, according to one or more embodiments.

Referring to FIG. 2, illustrated is a diagram depicting an example encoder 130 of the communication system 105 shown in FIG. 1, according to one or more embodiments. In some embodiments, the encoder 130 includes a non-transitory computer readable medium 210, a processor 220, a parity bit generation circuitry 230, and a codeword generation circuitry 240.

These components are embodied as application specific integrated circuit (ASIC), field programmable gate array (FPGA), or any combination of them. These components operate together to encode information data or input data to generate a codeword, e.g., by appending parity bits to information bits. In other embodiments, the encoder 130 includes more, fewer, or different components than shown in FIG. 2. For example, the encoder 130 lacks or bypasses the parity bit generation circuitry 230 and the codeword generation circuitry 240, and the processor 220 performs any process performed by the parity bit generation circuitry 230 and the codeword generation circuitry 240 disclosed herein.

The non-transitory computer readable medium 210 includes or corresponds to a storage device that stores software instructions when executed by the processor 220 cause the processor 220 to perform various processes of the encoder 130, the baseband circuitry 110, or the communication system 105 disclosed herein. Examples of the non-transitory computer readable medium 210 include a disk drive, a CD-ROM drive, a CD-R/RW drive, a DVD-ROM drive, a flash memory drive, tape drives of various formats, USB device, hard-drive, a network interface, or any storage device.

The processor 220 includes or corresponds to a hardware component that executes instructions stored by the non-transitory computer readable medium 210. In one aspect, the processor 220 obtains, accesses, retrieves or otherwise receives a generator matrix, and processes the generator matrix. In some embodiments, the generator matrix conforms to any IEEE 802.11 standard to generate low density parity check code. The generator matrix is stored or maintained by a storage device (not shown). The processor 220 obtains or receives the generator matrix from the storage device, in response to receiving an instruction to encode information data, or in response to detecting information data to be encoded. In one approach, the processor 220 divides the generator matrix into at least a first portion and a second portion. The second portion of the generator matrix allows parity bits to be directly generated without relying on a parity check matrix, in one or more embodiments.

Figure 3:
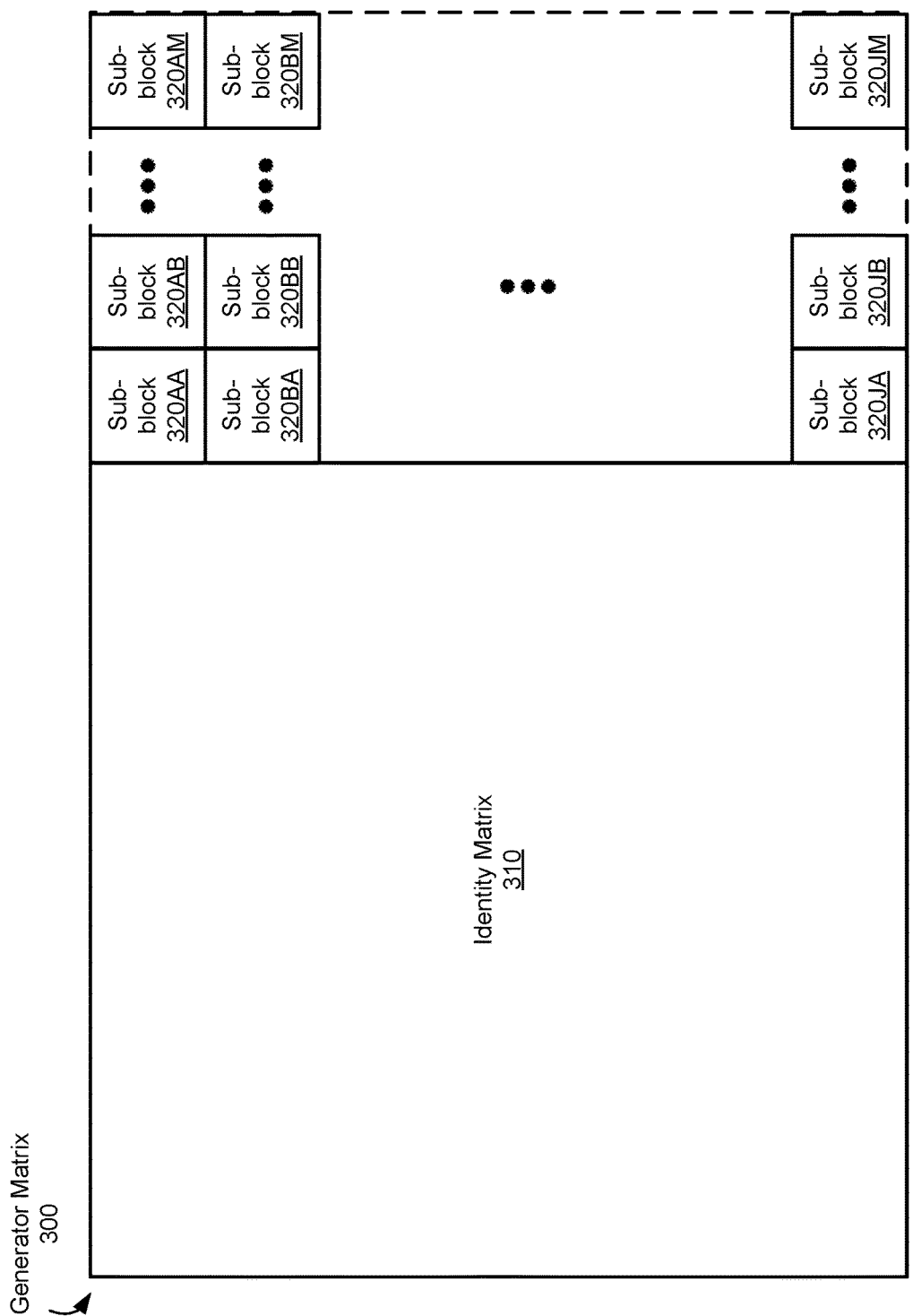
FIG. 3 is a diagram depicting an example generator matrix utilized by the encoder shown in FIG. 2, according to one or more embodiments.

Referring to FIG. 3, illustrated is a diagram depicting an example generator matrix 300 for encoding utilized by the encoder 130 shown in FIG. 2, according to one or more embodiments. The generator matrix 300 includes a first portion including an identity matrix 310 and a second portion including a plurality of sub-blocks 320AA 320AB . . . 320JM (generally referred to as "a sub-block 320" herein), in one or more embodiments. The sub-blocks 320 are arranged in an array including M number of columns and J number of rows. M and J are positive integers. Each sub-block 320 is a square matrix including Z number of rows and Z number of columns. Z is a positive integer. For example, M is twelve; J is twelve; and Z is 27, 54 or 81. The identity matrix 310 has J by Z number of rows and J by Z number of columns. In one aspect, codeword and parity bits are represented as following equations:

$$s \times G = c \qquad \text{Eq. (1)}$$

$$s \times G_2 = p \qquad \text{Eq. (2)}$$

where s is a vector of input data; G is the generator matrix; c is a vector of codeword; $G_2$ is the second portion of the generator matrix; and p is a vector of the parity bits. The processor 220 divides the generator matrix 300 into the first portion including the identity matrix 310 and the second portion including the plurality of sub-blocks 320 to generate parity bits.

Referring again to FIG. 2, the parity bit generation circuitry 230 includes or corresponds to circuitry that generates parity bits according to the second portion of the generator matrix 300. In one approach, the parity bit generation circuitry 230 generates the parity bits by selecting a sub-block 320 of a set of sub-blocks 320 in a row, and applying Z information bits to the selected sub-block 320. The parity bit generation circuitry 230 then selects a subsequent sub-block 320 in the set of sub-blocks 320 in the row, and applies the same Z information bits to the selected subsequent sub-block 320. The parity bit generation circuitry 230 repeats the process until the same Z information bits have been applied to all of the sub-blocks 320 in the row. Then, the parity bit generation circuitry 230 repeats the process with another group of Z information bits for a set of sub-blocks 320 in a subsequent row. When the parity bit generation process is complete, the parity bits equal the information bits times the second portion of the generator matrix per the above Eq. (2). The encoder processes the information bits Z at a time, with each group of Z information bits corresponding to one row of sub-blocks in the second portion of the generator matrix.

Figure 4:
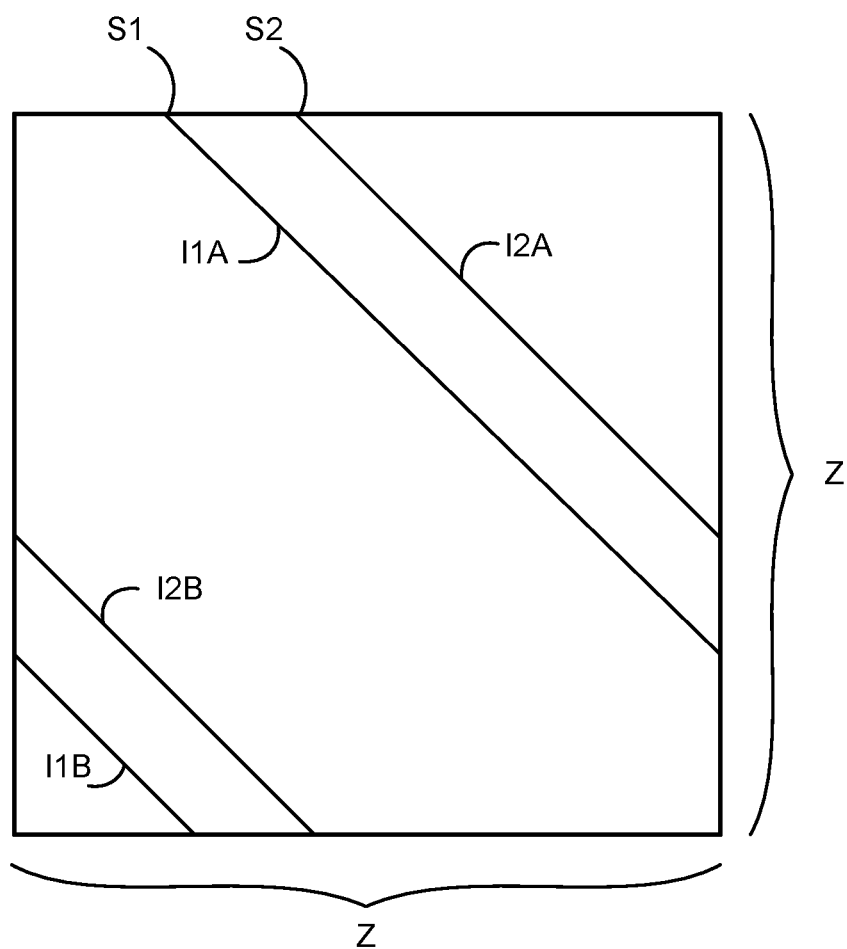
FIG. 4 is a diagram depicting an example sub-block of the generator matrix shown in FIG. 3, according to one or more embodiments.

Referring to FIG. 4, illustrated is a diagram depicting an example sub-block 320 of the generator matrix 300 shown in FIG. 3, according to one or more embodiments. In one aspect, the sub-block 320 includes a first set of elements (I1A and I1B) that are equivalent to bits of a Z by Z identity matrix that have been circularly shifted by a first amount S1 and a second set of elements (I2A and I2B) that are equivalent to bits of the Z by Z identity matrix that have been circularly shifted by a second amount S2. Remaining elements of the sub-block 320 are zeros, in one or more embodiments. The first amount S1 and the second amount S2 are different for different sub-blocks 320, in one or more embodiments. Moreover, some sub-blocks can contain more than two shifted identity matrices, contain one shifted identity matrix, or can contain only zeroes. The parity bit generation circuitry 230 exploits such arrangement of the elements in the sub-block 320 for instance to obtain the parity bits in a computationally efficient manner. For example, the parity bit generation circuitry 230 obtains the first amount S1 and the second amount S2 for the selected sub-block 320. In one approach, the parity bit generation circuitry 230 automatically detects the first amount S1 and the second amount S2 from the sub-block 320. Alternatively or additionally, the parity bit generation circuitry 230 stores first amounts S1 and second amounts S2 for different sub-blocks 320 on a storage device as a look up table, and retrieves the corresponding first amount S1 and second amount S2 for the selected sub-block 320, in one or more embodiments. The parity bit generation circuitry 230 receives Z number of bits of the information data (or input data), and generates first bits according to the first amount S1 and second bits according to the second amount S2. The first bits are equal to the Z number of input bits when circularly shifted according to the first amount S1, in one or more embodiments. Similarly, the second bits are equal to the Z number of input bits when circularly shifted according to the second amount S2, in one or more embodiments. The parity bit generation circuitry 230 stores results of bit-wise XOR operations performed on the second bits with bits in storage registers, and stores the results. Detailed implementations and operations of the parity bit generation circuitry 230 are provided below with respect to FIGS. 5 and 6.

Returning to FIG. 2, the codeword generation circuitry 240 appends the parity bits produced by the parity bit generation circuitry 230 to the information bits to produce a codeword, in one or more embodiments.

Figure 5:
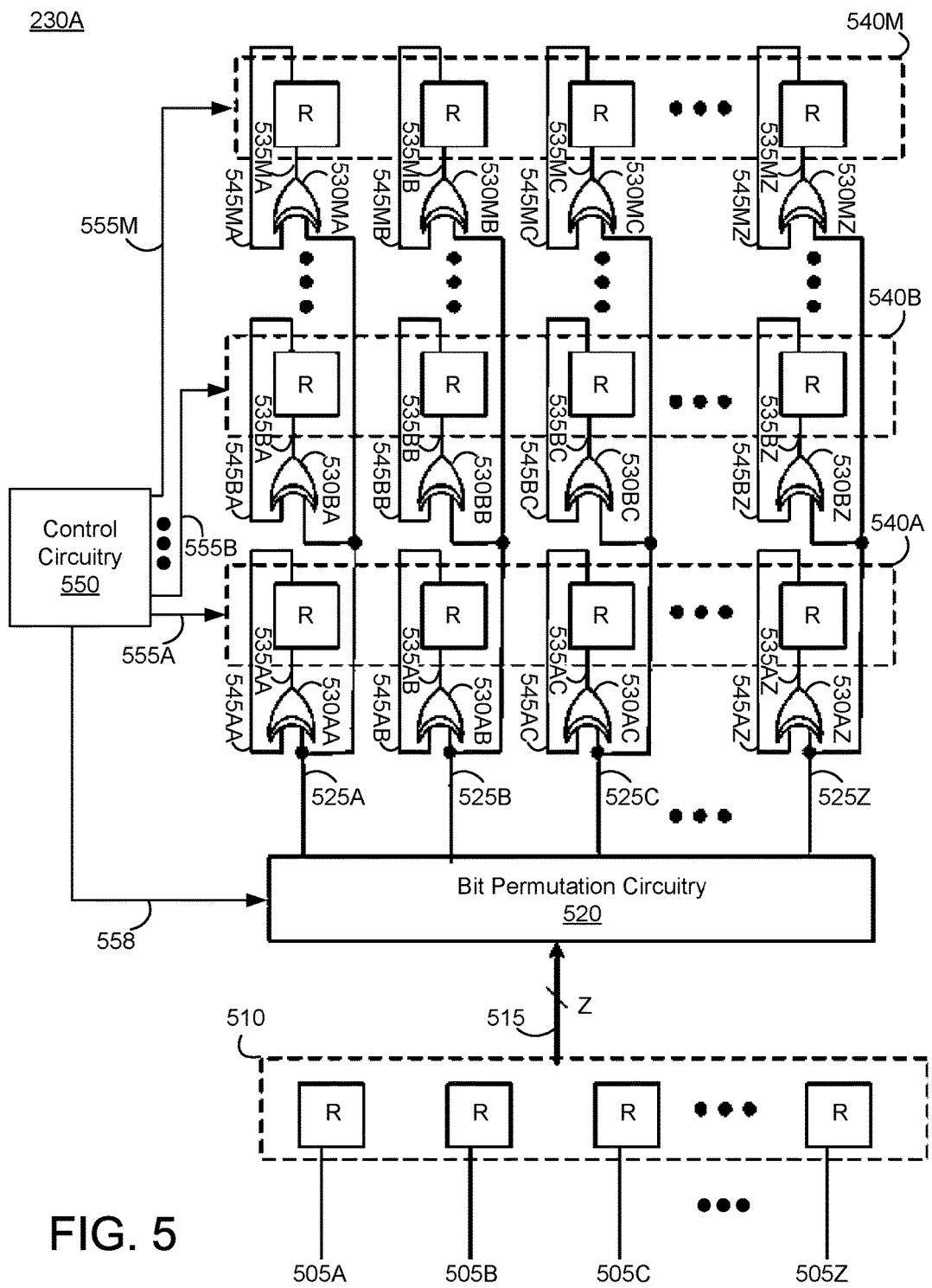
FIG. 5 is a diagram depicting an example parity bit generation circuitry shown in FIG. 2, according to one or more embodiments.

Referring to FIG. 5, illustrated is a diagram depicting an example parity bit generation circuitry 230A shown in FIG. 2, according to one or more embodiments. In some embodiments, the parity bit generation circuitry 230A includes input registers 510 (e.g., sequential logic gates or devices), bit permutation circuitry 520, XOR devices 530AA, 530AB . . . 530MZ (generally referred to as "a XOR device 530" herein) (e.g., combinatorial logic gates or devices), storage registers 540A, 540B . . . 540M (generally referred to as "a storage register 540" herein) (e.g., sequential logic gates or devices), and control circuitry 550. In one configuration, every one-bit register denoted "R" in FIG. 5 can be implemented with a one-bit D flip-flop. In one configuration, the XOR devices 530 and the storage registers 540 are arranged in an array having M number of rows and Z number of columns. Alternatively, the storage registers 540 can be organized into M separate Z-bit registers, e.g., a set of storage registers 540A, which includes Z one-bit registers, with each of the one-bit registers coupled to a corresponding XOR gate (e.g., XOR gate 530AA corresponding to the left-most one-bit register of the set of storage registers 540A). These components operate together to determine, produce, calculate, and/or generate parity bits, and store the parity bits in the M sets of storage registers 540, in one or more embodiments. In other embodiments, the parity bit generation circuitry 230A includes more, fewer, or different components than shown in FIG. 5. For example, the embodiments described below with respect to FIG. 6A has fewer XOR gates.

In FIG. 5, the input registers 510 include or correspond to devices or circuitries that receive Z number of input bits 505A, 505B . . . 505Z (generally referred to as "an input bit 505" herein) and produce, generate or output Z number of synchronized bits 515A, 515B . . . 515Z (generally referred to as "a synchronized bit 515" herein). In one configuration, the input registers 510 include Z number of registers, where each register of the Z number of registers includes an input port (e.g., the D input of a D flip-flop) to receive a corresponding input bit 505, and an output port (e.g., the Q output of a D flip-flop) to output a corresponding synchronized bit 515. In this configuration, the input registers 510 synchronize the input bits 505 according to a clock signal received (not shown), for example, from the control circuitry 550, and generate, send, transmit and/or output the synchronized bits 515 to the bit permutation circuitry 520.

The bit permutation circuitry 520 includes or corresponds to circuitry that receives the Z number of synchronized bits 515 and generates Z number of generated bits 525A, 525B . . . 525Z (generally referred to as "a generated bit 525" herein). In one configuration, the bit permutation circuitry 520 includes Z number of input ports, a control port, and Z number of outputs ports. Each input port of the bit permutation circuitry 520 is coupled to an output port of a corresponding input register 510, in one or more embodiments. The control port of the bit permutation circuitry 520 is coupled to the control circuitry 550, in one or more embodiments. Each output port of the bit permutation circuitry 520 is coupled to input ports of corresponding M number of XOR devices 530, in one or more embodiments. For example, an output port of the bit permutation circuitry 520 is coupled to input ports of M number of XOR devices 530 disposed on a same column. In one implementation, the bit permutation circuitry 520 is embodied as a barrel shifter or shift registers. In this configuration, the bit permutation circuitry 520 generates the generated bits 525 based on the synchronized bits 515 according to the control signal 558 from the control circuitry 550. The control signal 558 indicates an amount of shift, in one or more embodiments. In one aspect, the generated bits 525 are equal to the synchronized bits 515 circularly shifted according to the amount of shift indicated by the control signal 558. For example, if Z=7 and synchronized bits equal to [0 1 0 0 1 0 0] were applied to the bit permutation circuitry, and control signal 558 indicated a circular shift of two, the following generated bits would be output by the bit permutation circuitry 520: [0 0 0 1 0 0 1]. Each of the generated bits 525 is provided as input to XOR devices 530 disposed on the same column, in one or more embodiments. For example, generated bit 525A is applied to input ports of XOR devices 530AA, 530BA . . . 530MA.

In one aspect, each one-bit storage register within the storage registers 540 is coupled to a corresponding XOR device 530 to store an output of the corresponding XOR device 530. In one configuration, the XOR device 530 includes a first input port coupled to a corresponding output port of the bit permutation circuitry 520, a second input port coupled to an output port of the storage register 540, and an output port coupled to an input port of the storage register 540. As an example, the output port of XOR device 530AA is coupled to the input port of the left-most one-bit register within the set of storage registers 540A, the output port of XOR device 530BA is coupled to the input port of the left-most one-bit register within the set of storage registers 540B, and so on. Each of the storage registers 540 includes a clock port and a reset port coupled to the control circuitry 550, in one or more embodiments. For example, each set of storage registers 540 receives a unique clock signal (e.g., the clock signal 555A for the set of storage registers 540A is different than the clock signal 555B for the set of storage registers 540B) and each one-bit register within a particular set of storage registers receives a common clock signal 555 (e.g., all one-bit registers within the set of storage registers 540A receive the same clock signal 555A). In this configuration, the storage register 540 receives a reset signal from the control circuitry 550 through the reset port. In response to the reset signal, the storage register 540 resets any stored bit (e.g., every one-bit register within all sets of storage registers 540A to 540M can be reset at the same time), in one or more embodiments. The set of storage registers 540 receives a clock signal from the control circuitry 550 through the clock port, in one or more embodiments. In response to the clock signal, each set of storage registers 540 (e.g., register 540A) receives output bits 535 that are output from the output ports of Z of the XOR devices 530, and stores the received output bits 535, in one or more embodiments. For example, when the set of storage registers 540A is clocked, it stores the Z output bits produced by XOR devices 530AA, 530AB . . . 530AZ, each individual bit of the Z output bits being stored within one of the set of storage registers 540A. When the clock signal is not applied, the set of storage registers 540 holds (or maintains) and outputs the stored bit 545 irrespective of the output bit 535 from the XOR device 530, in one or more embodiments. For example, when the set of storage registers 540A is clocked, the data within the set of storage registers 540A is replaced with the outputs of XOR devices 530AA, 530AB . . . 530AZ, whereas the data within other sets of storage registers 540B, 540C, to 540M remains unchanged. In this way, each set of storage registers 540 is controlled by its own clock signal and the data within each storage register is updated only when its associated clock signal is asserted (or "clocked"). Each XOR device 530 performs an XOR operation on two bits: (1) the stored bit 545 output by the corresponding one of a set of storage registers 540 and (2) the corresponding generated bit 525 from the bit permutation circuitry 520. Each XOR device 530 produces a single output bit 535. For example, XOR device 530AA produces output bit 535AA such that it equals the XOR of bit 545AA (the bit output by the corresponding one-bit register—the left-most one-bit register within the set of storage registers 540A) and bit 525A (the corresponding generated bit produced by the bit permutation circuitry 520).

The control circuitry 550 includes or corresponds to circuitry that controls operations of the storage registers 540 and the bit permutation circuitry 520. The control circuitry 550 includes M number of clock output ports, a reset output port, and a control output port, in one or more embodiments. Each clock output port is coupled to all the one-bit registers within a corresponding set of storage registers 540 (e.g., all the one-bit registers within storage register 540A), in one or more embodiments. The reset output port is coupled to reset ports of all M storage registers 540, in one or more embodiments. The control output port of the control circuitry 550 is coupled to the control port of the bit permutation circuitry 520, in one or more embodiments. In this configuration, the control circuitry 550 obtains the shift amounts (e.g., S1 and S2) for a selected sub-block 320. The control circuitry 550 automatically determines the shift amounts for the selected sub-block 320, or retrieves stored shift amounts from a storage device (not shown) for the selected sub-block 320. The control circuitry 550 outputs a reset signal (not shown for simplicity) through the reset output port, outputs the clock signal 555 through a selected clock output port associated with the selected sub-block 320, and outputs the control signal 558 indicating one of the shift amounts of the selected sub-block 320 through the control output port, in one or more embodiments.

In one approach, the control circuitry 550 provides a reset signal to the M sets of storage registers 540 to reset stored data by the M sets of storage registers 540 during a first time period. During a second time period after the first time period, the control circuitry 550 outputs the control signal 558 indicating a first shift amount S1 to the bit permutation circuitry 520, and provides a clock signal 555 to a set of storage registers 540 (e.g., all of the one-bit registers within the set of storage registers 540A) associated with the selected sub-block to enable or cause the selected set of storage registers 540 to receive and store Z number of output bits 535 from the set of XOR devices 530 associated with the selected set of storage registers 540, in one or more embodiments. Because the storage registers 540 were reset during the first time period, the output bits 535 from the set of XOR devices 530 during the second time period are equal to the generated bits 525 from the bit permutation circuitry 520, in one or more embodiments. During a third time period after the second time period, the control circuitry 550 outputs the control signal 558 indicating a second shift amount S2 to the bit permutation circuitry 520, and provides the clock signal 555 to the selected set of storage registers 540 to enable or cause the selected set of storage registers 540 to receive and store Z number of output bits 535 from the set of XOR devices 530, in one or more embodiments. Thus, the set of XOR devices 530 performs bit-wise XOR operations on the stored bits 545 from the selected set of storage registers 540 and the generated bits 525 from the bit permutation circuitry 520 during the third time period, in one or more embodiments. Non-selected sets of storage registers 540 hold or maintain previous data and are prevented from storing new data during the second time period and the third time period, in one or more embodiments.

The control circuitry 550 selects a subsequent sub-block, and selects a subsequent set of storage registers 540 associated with the selected subsequent sub-block, in one or more embodiments. The control circuitry 550 applies a similar process performed for the previous sub-block as illustrated above on the selected subsequent sub-block to generate another portion of the parity bits without resetting stored data by the M sets of storage registers 540, in one or more embodiments.

An example of operation of parity bit generation circuitry 230A, shown in FIG. 5, will now be described. In one example, the set of storage register 540A will be associated with the first column of sub-blocks, 320AA, 320BA . . . 320JA. Similarly, the set of storage registers 540B will be associated with the second column of sub-blocks 320AB, 320BB . . . 320JB, and so on such that the set of storage registers 540M will be associated with the last column of sub-blocks 320AM, 320BM . . . 320JM.

Initially, control circuitry 550 resets all sets of storage registers 540A to 540M to zero. Then, the first group of Z input bits are clocked into the input register 510. While input register 510 holds these bits, the first row of sub-blocks 320AA, 320AB . . . 320AM are processed. The results of processing the first sub-block 320AA, are held in the set of storage registers 540A. Similarly, the results of processing the second sub-block 320AB, are held in the set of storage registers 540B, and so on such that the results of processing the last sub-block 320AM, are held in the set of storage registers 540M. At the conclusion of processing the first row of sub-blocks, the set of registers 540A holds Z bits that are equal to the product of the first Z input bits and sub-block 320AA (i.e., they hold the result of a vector of Z input bits times the first sub-block). Similarly, at the conclusion of processing the first row of sub-blocks, the set of storage registers 540B holds Z bits that are equal to the product of the first Z input bits and sub-block 320AB, and so on such that at the conclusion of processing the first row of sub-blocks, the set of storage registers 540M holds Z bits that are equal to the product of the first Z input bits and sub-block 320AM.

Then, the next group of Z input bits are clocked into the input register 510. While input register 510 holds those bits, the second row of sub-blocks 320BA, 320BB . . . 320BM, are processed. At the conclusion of processing for the second row of sub-blocks, the set of storage registers 540A holds Z bits that are equal to the product of the first 2Z input bits and sub-blocks 320AA, 320BA. That is, the set of storage registers 540A will hold the result of a vector times a matrix operation, where the vector contains the first 2Z input bits and the matrix is formed by the collection of two sub-blocks, e.g., blocks 320AA and 320BA. Similarly, at the conclusion of processing the second row of sub-blocks, the set of storage registers 540B will hold Z bits that are equal to the product of the first 2Z input bits and sub-blocks 320AB, 320BB, and so on such that the set of storage registers 540M will hold Z bits that are equal to the product of the first 2Z input bits and sub-blocks 320AM, 320BM.

Then, the next group of Z input bits are clocked into input register 510 and while register 510 holds those bits, the third row of sub-blocks are processed. This process continues, processing one row of sub-blocks while the input register holds one group of Z of the input bits, until the last group of input bits are held in the input register. At that time, while input register 510 holds the last (or Mth) group of Z input bits, the last row of sub-blocks is processed. At the conclusion of processing the last row of sub-blocks, the set of storage registers 540A holds Z bits equal to the product of a vector and a matrix, where the vector includes all the input bits and the matrix includes the first column of sub-blocks 320AA, 320BA . . . 320JA. Similarly, at the conclusion of processing the last row of sub-blocks, the set of storage registers 540B holds Z bits equal to the product of the same vector (of all the input bits) and the matrix formed by the second column of sub-blocks, 320AB, 320BB . . . 320JB, and so on such that the set of storage registers 540M holds Z bits equal to the product of the same vector (of all the input bits) and the matrix formed by the last column of sub-blocks 320AM, 320BM . . . 320JM. At this point, the sets of storage registers 540A to 540M hold all the parity bits, e.g., they hold bits equal to a product of the vector of input bits and the right portion of the generator matrix. Parity bit generation circuitry 230A forms this product of the vector of information bits and the generator matrix by processing the input bits in groups of Z, one at a time, with processing any particular group of Z input bits corresponding to one row of the sub-blocks.

Figure 7:
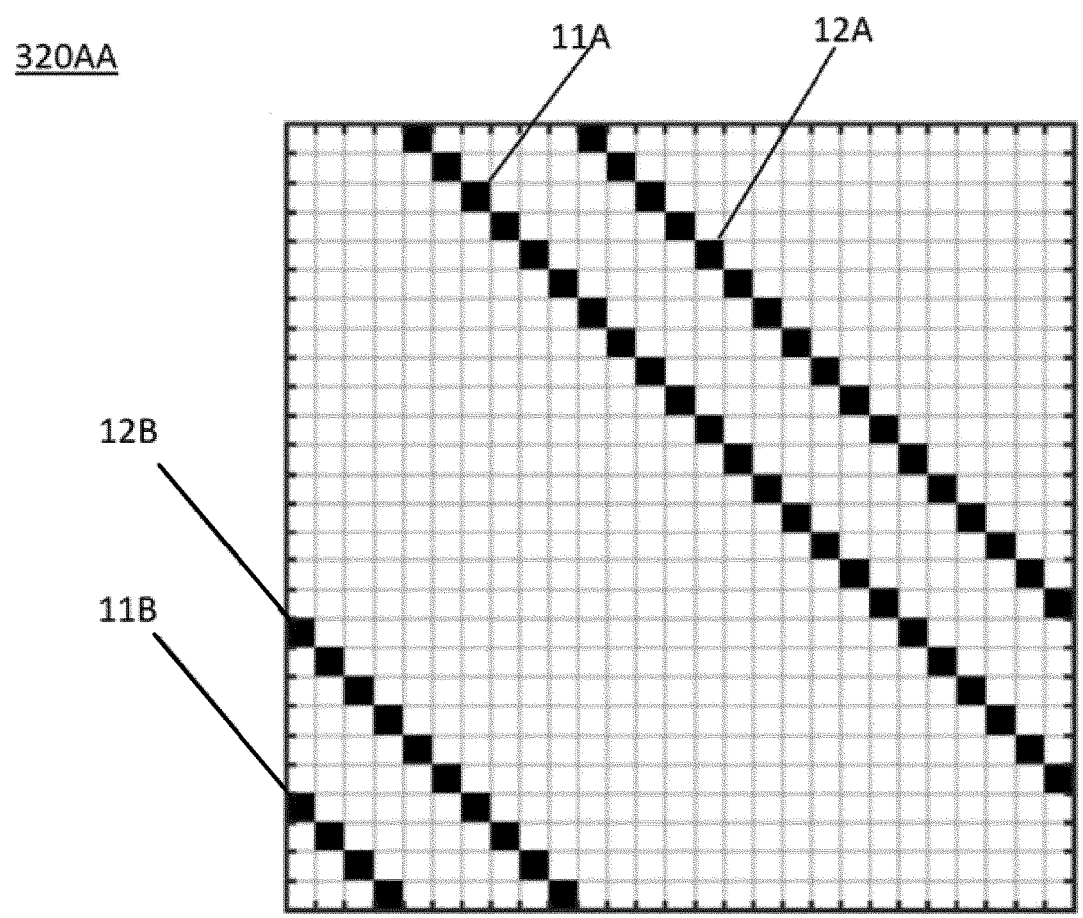
FIG. 7 is a diagram depicting another example sub-block of the generator matrix shown in FIG. 3, according to one or more embodiments.

FIG. 7 shows an example sub-block 320AA. In this example, Z=27, e.g., sub-block 320AA is a 27 by 27 sub-matrix. Unshaded boxes within sub-block 320AA correspond to locations of zeroes. Shaded boxes within sub-block 320AA correspond to locations of ones. Example sub-block 320AA includes two shifted identity matrices. Elements of the first shifted identity matrix correspond to diagonals 11A and 11B. Elements of the second shifted identity matrix correspond to diagonals 12A and 12B. Together, diagonals 11A and 11B correspond to a 27 by 27 identity matrix that has been circularly shifted by four places to the right. Together, diagonals 12A and 12B correspond to a 27 by 27 identity matrix that has been circularly shifted by ten places to the right.

Operation of parity bit generation circuitry 230A of FIG. 5 will now be explained with reference to the example sub-block 320AA shown in FIG. 7. As shown in FIG. 3, sub-block 320AA is the first sub-block of the first row of sub-blocks. Processing can begin with this sub-block.

Once the first group of input bits have been stored in the input register, the outputs of the input register 510 can be described as the vector of Z bits, $[i_0, i_1, \ldots, i_{Z-1}]$. While processing sub-block 320AA shown in FIG. 7, control circuitry 550 can instruct bit permutation circuitry 520 to produce outputs equal to inputs circularly shifted by four (i.e., to correspond to the diagonals 11A and 11B of sub-block 320AA). At this point, the bits generated by bit permutation circuitry 520 would be a collection of Z bits equal to the vector $[i_{23}, i_{24}, i_{25}, i_{26}, i_0, i_1, \ldots, i_{22}]$. Because the storage registers were all reset to zero before arrival of the first group of Z input bits, at this point the output bits generated by the first row of XOR devices, 530AA, 530AB . . . 530AZ, will equal $[i_{23}+0, i_{24}+0, i_{25}+0, i_{26}+0, i_0+0, i_1+0, \ldots, i_{22}+0]$, or simply $[i_{23}, i_{24}, i_{25}, i_{26}, i_0, i_1, \ldots, i_{22}]$ (where the "+" sign represents the XOR operation). Control circuitry 550 then clocks a set of storage registers 540A such that it holds Z bits equal to this same vector, $[i_{23}, i_{24}, i_{25}, i_{26}, i_0, i_1, \ldots, i_{22}]$. Control circuitry 550 would then instruct bit permutation circuitry 520 to produce outputs equal to inputs circularly shifted by ten (e.g., to correspond to the diagonals 12A and 12B of sub-block 320AA). At this point, the bits generated by bit permutation circuitry 520 would be a collection of Z bits equal to the vector $[i_{17}, i_{18}, \ldots, i_{26}, i_0, i_1, \ldots, i_{16}]$. At this point, the bits generated by the first row of XOR devices, 530AA, 530AB, . . . , 530AZ, will equal $[i_{23}+i_{17}, i_{24}+i_{18}, \ldots, i_{22}+i_{16}]$ (e.g., the bitwise XOR of the bits output by the set of storage registers 540A and the bits output by the bit permutation circuitry 520). Control circuitry 550 then clocks the set of storage registers 540A such that it then stores bits equal to this vector $[i_{23}+i_{17}, i_{24}+i_{18}, \ldots, i_{22}+i_{16}]$. At this point, processing of sub-block 320AA is complete, e.g., the set of storage registers 540A holds bits equal to the product of a vector and a matrix, where the vector includes the first group of Z input bits and the matrix is sub-block 320AA. In general, control circuitry 550 will shift the bit permutation circuitry once, and then clock a storage register once, for every shifted identity matrix contained within the sub-block being processed. The example sub-block illustrated in FIG. 7 contained two shifted identity matrices, so control circuitry 550 shifted bit permutation circuitry 520 twice and clocked the set of storage registers 540A twice. If a sub-block being processed contains zero shifted identity matrices, and is simply a null matrix, then control circuitry does not shift bit permutation circuitry 520 at all nor does it clock any of the storage registers. Rather, such sub-matrices are skipped and processing moves on to the next non-zero sub-matrix. Also, processing of subsequent rows of sub-blocks is similar to processing of the first row, except that the set of storage registers 540A can contain non-zero results from processing of sub-blocks in prior rows.

Figure 6A:
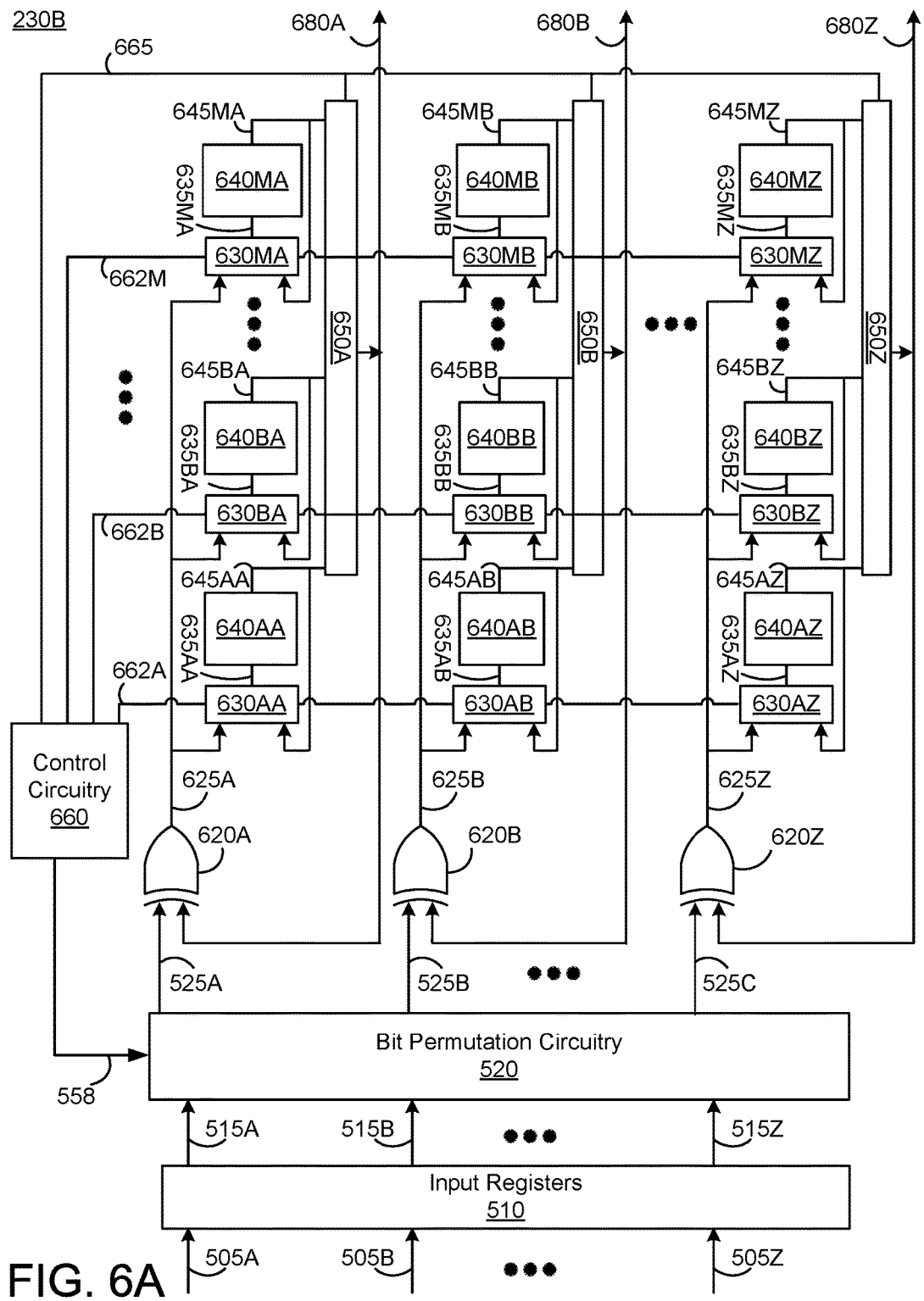
FIG. 6A is a diagram depicting another example parity bit generation circuitry shown in FIG. 2, according to one or more embodiments.

Referring to FIG. 6A, illustrated is a diagram depicting another example parity bit generation circuitry 230B shown in FIG. 2, according to one or more embodiments. The example parity bit generation circuitry 230B of FIG. 2 can for instance be one implementation or embodiment of the parity bit generation circuitry depicted in FIG. 6B. Encoding is performed by the parity bit generation circuitry 230B and involves Z information bits at a time. The bank of M by Z storage registers 640 is similar to the collection of M sets of storage registers 540 shown in FIG. 5. In one aspect, the parity bit generation circuitry 230B includes Z number of XOR devices 620 (instead of M by Z number of XOR devices 530 shown in FIG. 5). The multiplexers 650 (also referred to herein as "feedback multiplexers 650") route data from the corresponding storage registers 640 back to the XOR devices 620, in one or more embodiments. The demultiplexers 630 (also referred to herein as "loading multiplexers 630") cause the outputs of the XOR devices 620 to be stored in the appropriate storage registers 640, in one or more embodiments. For example, when processing sub-blocks in the first column of sub-blocks (e.g., 320AA, 320BA . . . 320JA), the DEMUX 630 routes the output of the XOR devices 620 to the first set of registers in bank 640, MUX 650 routes the output of that first set of registers to the input of XOR devices 620 and contents of other sets of registers in bank 640 remain unchanged; when processing sub-blocks in the second column of sub-blocks (e.g., 320AB, 320BB . . . 320JB), the DEMUX 630 routes the output of the XOR devices 620 to the second set of registers in bank 640, MUX 650 routes the output of that second set of registers to the input of XOR devices 620 and contents of other sets of registers in bank 640 remain unchanged; and so on.

In some embodiments, the parity bit generation circuitry 230B includes input registers 510, a bit permutation circuitry 520, XOR devices 620A, 620B . . . 620Z (generally referred to as "a XOR device 620" herein), storage registers 640AA, 640AB . . . 640MZ (generally referred to as "a storage register 640" herein), the control circuitry 660, loading multiplexers 630AA, 630AB . . . 630MZ (generally referred to as "a loading multiplexer 630" herein) and feedback multiplexers 650A, 650B . . . 650Z (generally referred to as "a feedback multiplexer 650" herein). In one configuration, the storage registers 640 and the loading multiplexers 630 are arranged in an array having M number of rows and Z number of columns. The input registers 510 and the bit permutation circuitry 520 are configured in a similar manner as those in the parity bit generation circuitry 230A shown in FIG. 5, in one or more embodiments. Thus, detailed description thereof is omitted herein for the sake of brevity. In other embodiments, the parity bit generation circuitry 230B includes more, fewer, or different components than shown in FIGS. 6A and 6B. For example, the parity bit generation circuitry 230B lacks the input registers 510.

In one configuration, each of the XOR devices 620 includes a first input port, a second input port, and an output port. The first input port of the XOR device 620 is coupled to a corresponding output port of the bit permutation circuitry 520, in one or more embodiments. The second input port of the XOR device 620 is coupled to an output port of a corresponding feedback multiplexer 650, in one or more embodiments. The output port of the XOR device 620 is coupled to first input ports of M number of loading multiplexers 630 disposed on a same column.

In some embodiments, the loading multiplexer 630 is a two input multiplexer that electrically couples a corresponding XOR device 620 to a corresponding storage register 640. In one configuration, the loading multiplexer 630 includes a first input port coupled to the output port of the corresponding XOR device 620, a second input port coupled to an output port of the corresponding storage register 640, a control port coupled to the control circuitry 660, and an output port coupled to an input port of the corresponding storage register 640. In this configuration, the loading multiplexer 630 receives an output bit 625 from the XOR device 620 through the first input port, stored bit from the storage register 640 through the second input port, and a load signal 662 from the control circuitry 660 through the control port. The loading multiplexer 630 identifies, selects or uses one of the first input port and the second input port according to the load signal 662, and electrically couples the selected one of the first input port and the second input port to the output port of the loading multiplexer 630 to output a selected bit 635 according to the load signal 662.

Each storage register 640 holds, saves or stores a corresponding bit. The storage register 640 includes an input port, an output port, a reset port, and a clock port, in one or more embodiments. The input port of the storage register 640 is coupled to the output port of the corresponding loading multiplexer 630, in one or more embodiments. The output port of the storage register 640 is coupled to an input port of the loading multiplexer 630, and a corresponding input port of the feedback multiplexer 650, in one or more embodiments. The reset port and the clock port of the storage register 640 are coupled to the control circuitry 660, in one or more embodiments. In this configuration, the storage register 640 receives a reset signal from the control circuitry 660 through the reset port. In response to the reset signal, the storage register 640 resets any stored bit, in one or more embodiments. The storage register 640 also receives a clock signal from the control circuitry 660 through the clock port, in one or more embodiments. In response to the clock signal, the storage register 640 receives and stores a selected bit 635 that is output from the loading multiplexer 630, in one or more embodiments. When the clock signal is not applied, the storage register 640 holds and outputs the stored bit 645 irrespective of the selected bit 635 from the loading multiplexer 630, in one or more embodiments.

In some embodiments, the feedback multiplexer 650 is a M input multiplexer that generates or outputs one of M number of stored bits 645 from storage registers 640 disposed on a column to the XOR device 620 as a feedback, in one or more embodiments. In one configuration, the feedback multiplexer 650 includes M number of input ports, a control port, and an output port. Each of the M number of input ports of the feedback multiplexer 650 is coupled to an output port of a corresponding storage register 640 from the M number storage registers 640 disposed on the same column, in one or more embodiments. The control port of the feedback multiplexer 650 is coupled to the control circuitry 660, in one or more embodiments. The output port of the feedback multiplexer 650 is coupled to an input port of a corresponding XOR device 620, in one or more embodiments. In this configuration, the feedback multiplexer 650 receives the M number of stored bits 645 from the M number storage registers 640 disposed on the same column through corresponding input ports of the feedback multiplexer 650, and a control signal 665 from the control circuitry 660, in one or more embodiments. The feedback multiplexer 650 selects one of the M number of input ports of the feedback multiplexer 650 according to the control signal 665, and electrically couples the selected input port to the output port of the feedback multiplexer 650 to output the selected bit 680 to the input of the XOR device 620, in one or more embodiments.

The control circuitry 660 is circuitry that controls operations of the storage registers 640, the bit permutation circuitry 520, the loading multiplexers 630, and the feedback multiplexers 650, in one or more embodiments. The control circuitry 660 includes M number of multiplexer control output ports, a feedback control port, a reset output port, a clock output port, and a control output port, in one or more embodiments. Each of the multiplexer control ports of the control circuitry 660 is coupled to control ports of a corresponding set of Z number of loading multiplexers 630, in one or more embodiments. The feedback control port of the control circuitry 660 is coupled to control ports of the Z number of feedback multiplexers 650, in one or more embodiments. The clock output port of the control circuitry 660 is coupled to clock ports of the M sets of the storage registers 640, in one or more embodiments. The reset output port is coupled to reset ports of the M sets of storage registers 640, in one or more embodiments. The control output port of the control circuitry 660 is coupled to the control port of the bit permutation circuitry 520, in one or more embodiments. In this configuration, the control circuitry 660 obtains shift amounts for a selected sub-block 320. The control circuitry 660 automatically determines the shift amounts for the selected sub-block 320, or retrieves stored shift amounts from a storage device (not shown) for the selected sub-block 320. The control circuitry 660 outputs a reset signal (not shown for simplicity) through the reset output port, outputs a clock signal (not shown for simplicity) through the clock output port, outputs the load signal 662 through a selected one of the multiplexer control output ports, outputs the feedback control signal 665 through the feedback control port, and outputs the control signal 558 indicating one of the shift amounts S1, S2 of the selected sub-block 320 through the control output port, in one or more embodiments.

In one aspect, the storage registers 640 operate according to, or based on a single clock signal from the control circuitry 660. The control circuitry 660 selects (e.g., identifies, uses and/or enables) a set of loading multiplexers 630 corresponding to a selected sub-block 320, and selects outputs of a set of storage registers 640 to be provided as inputs to the XOR devices 620 according to the selected sub-block 320, in one or more embodiments. Remaining loading multiplexers 630 associated with non-selected sub-blocks are configured such that the output ports of the XOR devices 620 are electrically decoupled from the input ports of the remaining sets of storage registers 640 associated with the non-selected sub-blocks 320, in one or more embodiments. Moreover, the feedback multiplexers 650 are configured such that the input ports of the XOR devices 620 are electrically decoupled from the outputs ports of the remaining sets of storage registers 640 associated with the non-selected sub-blocks 320, in one or more embodiments. Hence, the XOR devices 620 perform bit-wise XOR operations on the stored bits from the selected set of storage registers 640 and the generated bits 525 from the bit permutation circuitry 520, in one or more embodiments. In addition, the selected set of storage registers stores the results of the bit-wise XOR operations as a portion of parity bits, in one or more embodiments. Moreover, the non-selected set of storage registers 640 holds its previous stored data, without being affected by the generated bits 525 from the bit permutation circuitry 520, in one or more embodiments.

The control circuitry 660 selects a subsequent sub-block, and selects a subsequent set of storage registers 640 associated with the selected subsequent sub-block, in one or more embodiments. The control circuitry 660 applies a similar process performed for the previous sub-block as illustrated above on the selected subsequent sub-block to generate another portion of the parity bits, in one or more embodiments.

Figure 6B:
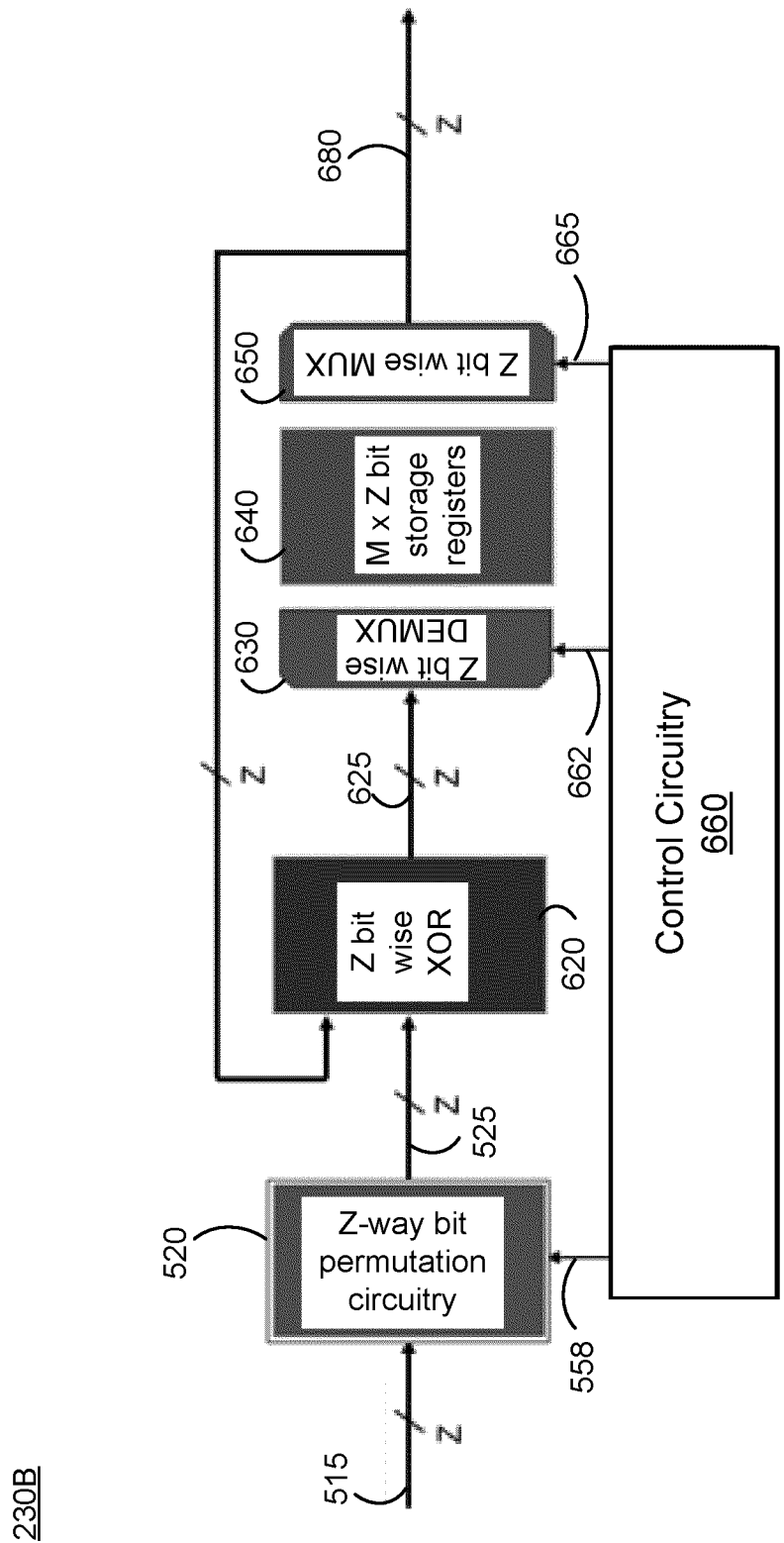
FIG. 6B is a diagram depicting higher level implementation of the parity bit generation circuitry shown in FIG. 6A, according to one or more embodiments.

Comparing FIGS. 5 and 6, it can be seen that the parity bit generation circuitry 230B shown in the FIGS. 6A and 6B contains fewer XOR devices than the parity bit generation circuitry 230A FIG. 5. For example, the parity bit generation circuitry 230A shown in FIG. 5 includes M times Z number of XOR devices, whereas the parity bit generation circuitry 230B shown in the FIGS. 6A and 6B includes Z number of XOR devices. Conversely, the parity bit generation circuitry 230B shown in FIGS. 6A and 6B includes loading and feedback multiplexors, which are not used in the parity bit generation circuitry 230A shown in FIG. 5. The parity bit generation circuitries 230A, 230B can be used to produce the same parity bits that are equal to the product of the vector of all the information bits and the right portion of the generator matrix.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

I claim:

1. An encoder for wireless local area networking (WLAN) communication, comprising:

a processor configured to divide a generator matrix into a first portion and a second portion, the second portion of the generator matrix including an array of sub-blocks, the array of sub-blocks arranged in rows and columns, each row including M number of sub-blocks and each column including J number of sub-blocks, wherein M and J are integers, each sub-block including Z number of rows and Z number of columns, wherein Z is an integer, a sub-block of the array of sub-blocks including (i) a first set of elements circularly shifted from an identity matrix by a first amount, and (ii) a second set of elements circularly shifted from the identity matrix by a second amount; and parity bit generation circuitry coupled to the processor, the parity bit generation circuitry configured to generate parity bits according to the array of sub-blocks, the parity bit generation circuitry including:

bit permutation circuitry,

Z number of XOR devices coupled to the bit permutation circuitry,

M sets of storage registers, each set of the M sets of storage registers including Z number of storage registers, each of the Z number of storage registers coupled to a corresponding XOR device of the Z number of XOR devices, and control circuitry coupled to the bit permutation circuitry and the M sets of storage registers, the control circuitry configured to:

cause the bit permutation circuitry to generate Z number of first bits according to Z number of input bits and the first amount, the Z number of first bits equal to the Z number of input bits when circularly shifted according to the first amount, each of the Z number of first bits provided as input to a corresponding XOR device of the Z number of XOR devices, cause each storage register of a first set of the M sets of storage registers to store an output of the corresponding XOR device of the Z number of XOR devices, cause the bit permutation circuitry to generate Z number of second bits according to the Z number of input bits and the second amount, the Z number of second bits equal to the Z number of input bits when circularly shifted according to the second amount, and cause the Z number of XOR devices to perform bit-wise XOR operations on the stored Z number of outputs from the first set of the M sets of storage registers and the generated Z number of second bits from the bit permutation circuitry, to provide a portion of the parity bits.

2. The encoder of claim 1, wherein the control circuitry is configured to:
cause the first set of the M sets of storage registers to store results of the bit-wise XOR operations performed on the stored Z number of outputs from the first set of the M sets of storage registers and the generated Z number of second bits from the bit permutation circuitry, while sets of the M sets of storage registers other than the first set do not store the results of the bit-wise XOR operations.

3. The encoder of claim 1, wherein the control circuitry is configured to:
reset the first set of the M sets of storage registers during a first time period;
cause the first set of the M sets of storage registers to store results of the bit-wise XOR operations performed on the Z number of outputs from the first set of the M sets of storage registers and the generated Z number of first bits from the bit permutation circuitry during a second time period after the first time period; and
cause the first set of the M sets of storage registers to store results of the bit-wise XOR operations performed on the stored Z number of outputs from the first set of the M sets of storage registers and the generated Z number of second bits from the bit permutation circuitry, during a third time period after the second time period.

4. The encoder of claim 3, wherein each XOR device of the Z number of XOR devices includes:
a first input port coupled to a corresponding output port of Z number of output ports of the bit permutation circuitry;
a second input port coupled to an output port of a corresponding storage register of the first set; and
an output port coupled to an input port of the corresponding storage register of the first set.

5. The encoder of claim 1,
wherein another sub-block of the array of sub-blocks includes a third set of elements circularly shifted from the identity matrix by a third amount and a fourth set of elements circularly shifted from the identity matrix by a fourth amount.

6. The encoder of claim 5, wherein the parity bit generation circuitry further includes Z number of additional XOR devices coupled to the bit permutation circuitry, wherein the control circuitry is further configured to:
cause the bit permutation circuitry to generate Z number of third bits according to the Z number of input bits and the third amount, the Z number of third bits equal to the Z number of input bits when circularly shifted according to the third amount, each of the Z number of third bits provided as input to a corresponding XOR device of the Z number of additional XOR devices, cause each storage register of a second set of the M sets of storage registers to store an output of the corresponding XOR device of the Z number of additional XOR devices, cause the bit permutation circuitry to generate Z number of fourth bits according to the Z number of input bits and the fourth amount, the Z number of fourth bits equal to the Z number of input bits when circularly shifted according to the fourth amount, and cause the Z number of additional XOR devices to perform bit-wise XOR operations on the stored Z number of outputs from the second set of the M sets of storage registers and the generated Z number of fourth bits from the bit permutation circuitry, to provide another portion of the parity bits.

7. The encoder of claim 6, wherein the control circuitry is configured to:
cause the second set of the M sets of storage registers to store results of the bit-wise XOR operations performed on the stored Z number of outputs from the second set of the M sets of storage registers and the generated Z number of fourth bits from the bit permutation circuitry, while sets of the M sets of storage registers other than the second set do not store the results of the additional bit-wise XOR operations.

8. The encoder of claim 6, wherein the control circuitry is configured to:
reset the first set of the M sets of storage registers and the second set of the M sets of storage registers during a first time period;
cause the first set of the M sets of storage registers to store results of the bit-wise XOR operations performed on the Z number of outputs from the first set of the M sets of storage registers and the generated Z number of first bits from the bit permutation circuitry during a second time period after the first time period;
cause the first set of the M sets of storage registers to store results of the bit-wise XOR operations performed on the stored Z number of outputs from the first set of the M sets of storage registers and the generated Z number of second bits from the bit permutation circuitry during a third time period after the second time period;
cause the second set of the M sets of storage registers to store the store results of the bit-wise XOR operations performed on the Z number of outputs from the second set of the M sets of storage registers and the generated Z number of third bits from the bit permutation circuitry during a fourth time period after the third time period; and
cause the second set of the M sets of storage registers to store results of the bit-wise XOR operations performed on the stored Z number of outputs from the second set of the M sets of storage registers and the generated Z number of fourth bits from the bit permutation circuitry during a fifth time period after the fourth time period.

9. The encoder of claim 1, wherein the parity bit generation circuitry further includes:

Z number of multiplexers, each multiplexer of the Z number of multiplexers coupled between the corresponding XOR device and a corresponding storage register of the first set; and Z number of additional multiplexers, each multiplexer of the Z number of additional multiplexers coupled between the corresponding XOR device and a corresponding storage register of a second set of the M sets of storage registers.

10. The encoder of claim 9, wherein the parity bit generation circuitry further includes:

a feedback multiplexer including:

M number of input ports, each of the M number of input ports coupled to an output port of a corresponding storage register of M number of storage registers, each of the M number of storage registers from a different set of the M sets, and an output port coupled to an input port of a XOR device of the Z number of XOR devices.

11. The encoder of claim 10, wherein the control circuitry is configured to:

cause the feedback multiplexer to electrically couple an output port of a storage register of the M number of storage registers to the input port of the XOR device, while a multiplexer of the Z number of multiplexers electrically couples an output port of the XOR device to an input port of the storage register of the M number of storage registers.

12. The encoder of claim 1, wherein each XOR device of the Z number of XOR devices is a two-input XOR device.

13. The encoder of claim 1, wherein the first portion of the generator matrix is an identity matrix including J by Z number of rows and J by Z number of columns.

14. An encoder for communication, comprising:

a processor configured to divide a generator matrix into a first portion and a second portion, the second portion of the generator matrix including an array of sub-blocks, the array of sub-blocks arranged in rows and columns, each row including M number of sub-blocks and each column including J number of sub-blocks, each sub-block including Z number of rows and Z number of columns, a sub-block of the array of sub-blocks including (i) a first set of elements circularly shifted from an identity matrix by a first amount, and (ii) a second set of elements circularly shifted from the identity matrix by a second amount; and parity bit generation circuitry coupled to the processor, the parity bit generation circuitry configured to generate parity bits according to the array of sub-blocks, the parity bit generation circuitry including:

bit permutation circuitry,

Z number of XOR devices coupled to the bit permutation circuitry,

M sets of storage registers, each set of the M sets of storage registers including Z number of storage registers, each of the Z number of storage registers coupled to a corresponding XOR device of the Z number of XOR devices, and a control circuitry coupled to the bit permutation circuitry and the M sets of storage registers, the control circuitry configured to:

cause the bit permutation circuitry to generate Z number of first bits according to Z number of input bits and the first amount, the Z number of first bits equal to the Z number of input bits when circularly shifted according to the first amount, each of the Z number of first bits provided as input to a corresponding XOR device of the Z number of XOR devices, cause each storage register of a first set of the M sets of storage registers to store an output of the corresponding XOR device of the Z number of XOR devices, cause the bit permutation circuitry to generate Z number of second bits according to the Z number of input bits and the second amount, the Z number of second bits equal to the Z number of input bits when circularly shifted according to the second amount, and cause the Z number of XOR devices to perform bit-wise XOR operations on the stored Z number of outputs from the first set of the M sets of storage registers and the generated Z number of second bits from the bit permutation circuitry, to provide a portion of the parity bits.

15. The encoder of claim 14, wherein the control circuitry is configured to:

cause the first set of the M sets of storage registers to store results of the bit-wise XOR operations performed on the stored Z number of outputs from the first set of the M sets of storage registers and the generated Z number of second bits from the bit permutation circuitry, while sets of the M sets of storage registers other than the first set do not store the results of the bit-wise XOR operations.

16. The encoder of claim 14, wherein the control circuitry is configured to:

reset the first set of the M sets of storage registers during a first time period;

cause the first set of the M sets of storage registers to store the Z number of first bits during a second time period after the first time period; and cause the first set of the M sets of storage registers to store results of the bit-wise XOR operations performed on the stored Z number of outputs from the first set of the M sets of storage registers and the generated Z number of second bits from the bit permutation circuitry during a third time period after the second time period.

17. The encoder of claim 16, wherein each XOR device of the Z number of XOR devices includes:

a first input port coupled to a corresponding output port of Z number of output ports of the bit permutation circuitry;

a second input port coupled to an output port of a corresponding storage register of the first set; and an output port coupled to an input port of the corresponding storage register of the first set.

18. The encoder of claim 14, wherein another sub-block of the array of sub-blocks includes a third set of elements circularly shifted from the identity matrix by a third amount and a fourth set of elements circularly shifted from the identity matrix by a fourth amount.

19. The encoder of claim 18, wherein the parity bit generation circuitry further includes Z number of additional XOR devices coupled to the bit permutation circuitry, wherein the control circuitry is further configured to:

cause the bit permutation circuitry to generate Z number of third bits according to the Z number of input bits and the third amount, the Z number of third bits equal to the Z number of input bits when circularly shifted according to the third amount, each of the Z number of third bits provided as input to a corresponding XOR device of the Z number of additional XOR devices, cause each storage register of a second set of the M sets of storage registers to store an output of the corresponding XOR device of the Z number of additional XOR devices, cause the bit permutation circuitry to generate Z number of fourth bits according to the Z number of input bits and the fourth amount, the Z number of fourth bits equal to the Z number of input bits when circularly shifted according to the fourth amount, and cause the Z number of additional XOR devices to perform additional bit-wise XOR operations on the stored Z number of outputs from the second set of the M sets of storage registers and the generated Z number of fourth bits from the bit permutation circuitry, to provide another portion of the parity bits.

20. A non-transitory computer readable medium storing instructions when executed by a processor cause the processor to:

divide a generator matrix into a first portion and a second portion, the second portion of the generator matrix including an array of sub-blocks, the array of sub-blocks arranged in rows and columns, each row including M number of sub-blocks and each column including J number of sub-blocks, each sub-block including Z number of rows and Z number of columns, a sub-block of the array of sub-blocks including (i) a first set of elements circularly shifted from an identity matrix by a first amount, and (ii) a second set of elements circularly shifted from the identity matrix by a second amount;

cause a bit permutation circuitry to generate Z number of first bits according to Z number of input bits and the first amount, the Z number of first bits equal to the Z number of input bits when circularly shifted according to the first amount, each of the Z number of first bits provided as input to a corresponding XOR device of Z number of XOR devices;

cause each storage register of a first set of M sets of storage registers to store an output of the corresponding XOR device of the Z number of XOR devices;

cause the bit permutation circuitry to generate Z number of second bits according to the Z number of input bits and the second amount, the Z number of second bits equal to the Z number of input bits when circularly shifted according to the second amount; and cause the Z number of XOR devices to perform bit-wise XOR operations on the stored Z number of outputs from the first set of the M sets of storage registers and the generated Z number of second bits from the bit permutation circuitry, to provide a portion of parity bits.

* * * * *